US006674650B1

(12) United States Patent
Davis et al.

(10) Patent No.: US 6,674,650 B1
(45) Date of Patent: Jan. 6, 2004

(54) CARD RETENTION ASSEMBLY

(75) Inventors: David R. Davis, Sioux City, SD (US); Paul Hooper, El Paso, TX (US); Jorge A. Moriel, El Paso, TX (US); John J. Daly, Irvine, CA (US); Allan L. Klink, Sioux City, SD (US); Dirk Cosner, Sioux City, SD (US)

(73) Assignee: Gateway, Inc., Poway, CA (US)

( * ) Notice: Subject to any disclaimer, the term of this patent is extended or adjusted under 35 U.S.C. 154(b) by 460 days.

(21) Appl. No.: 09/595,193

(22) Filed: Jun. 16, 2000

(51) Int. Cl.⁷ .............................. H05K 7/14; H05K 7/18
(52) U.S. Cl. .................. 361/796; 361/752; 361/753; 361/801; 361/769; 361/747; 361/825
(58) Field of Search .................. 361/796, 752, 361/753, 747, 760, 748, 769, 801, 825

(56) References Cited

U.S. PATENT DOCUMENTS

| 5,317,483 A | 5/1994 | Swindler |
| 5,640,309 A | 6/1997 | Carney et al. |
| 5,673,175 A | 9/1997 | Carney et al. |
| 5,694,291 A * | 12/1997 | Feightner ............. 361/683 |
| 5,822,196 A | 10/1998 | Hastings et al. ............. 361/801 |
| 5,914,854 A * | 6/1999 | Holt ............. 361/683 |
| 5,967,466 A | 10/1999 | Osborne et al. |
| 5,982,627 A | 11/1999 | Haughton et al. |
| 6,160,712 A * | 12/2000 | Itai et al. ............. 361/759 |
| 6,278,614 B1 * | 8/2001 | Beaman et al. ............. 361/752 |

FOREIGN PATENT DOCUMENTS

| DE | 44 03 907 A1 | 10/1995 |
| DE | 198 06 026 A1 | 9/1999 |
| EP | 0831387 | 9/1996 |
| EP | 0811903 | 6/1997 |

* cited by examiner

Primary Examiner—Michael Sherry
Assistant Examiner—Thanh Yen Tran
(74) Attorney, Agent, or Firm—Scott Charles Richardson; Kevin E. West; Suiter—West

(57) ABSTRACT

A card retention assembly for retaining one or more expansion cards within the chassis of an electronic device such as a computer system, server, photocopier, facsimile machine, printer, or the like includes a card retention assembly that engages the mounting bracket securing tab of an expansion card received in the chassis. In this manner, the card retention assembly at least partially restrains the tab for securing the expansion card in the chassis.

17 Claims, 6 Drawing Sheets

CARD RETENTION ASSEMBLY

FIELD OF THE INVENTION

The present invention generally relates to electronic devices capable of employing expansion cards which provide specialized functions or resources to the device, or which extend the devices' ability to communicate with and/or control peripheral devices, networks, or the like. In particular, the present invention relates to an electronic device having a chassis including a card retention assembly for retaining or securing expansion cards within the chassis while allowing installation and removal of the expansion cards without the use of fasteners or tools.

BACKGROUND OF THE INVENTION

Electronic devices, particularly computer systems, servers, photocopiers, facsimile machines, printers, control equipment, medical equipment, telecommunication equipment, and the like often include one or more expansion cards which provide specialized functions or resources to the device, or which extend the devices' ability to communicate with and/or control peripheral devices, networks or the like. Such expansion cards typically comprise generally rectangular printed circuit boards having an edge connector formed along one side edge. The edge connector is inserted into an expansion slot disposed on a system board (often referred to in the art as a motherboard) mounted within the electronic device to couple the installed expansion card to other electronic components in the device. In typical configurations, the expansion slots are oriented so the expansion cards installed therein are arranged in a spaced apart, generally parallel array wherein end edges of the cards are aligned with each other.

Extending along the aligned end edges of the expansion cards are metal mounting brackets having outwardly bent tabs positioned adjacent to the side edges of the cards opposite the edge connector. When the expansion cards are installed within the chassis of the electronic device and seated in the expansion slot, these tabs rest against a ledge surface formed inside the chassis. Notches disposed in the tabs overlie and register with holes formed in the ledge surface allowing the mounting bracket to be secured to the surface by a screw or bolt extending through the tab notch and threaded into the hole.

Because a fastener such as a screw or bolt is used to secure the mounting bracket tab to the ledge surface, installation and removal of expansion cards is somewhat difficult and time consuming, and requires the use of tools such as a screwdriver or wrench. Consequently, it would be advantageous to eliminate the fastener, relying on the expansion slot itself to hold the expansion card in place. However, electronic devices, particularly personal computers, are often subjected to substantial shock and vibration during delivery from the manufacturer to a retailer or the consumer. If not retained therein by the fastener, this shock and vibration could cause expansion cards to become unseated from their expansion slots on the system board causing the expansion card to not function properly. Consequently, it would be advantageous to provide an electronic device having a case or housing comprising apparatus for securing expansion cards within the chassis of an electronic device and allowing quick removal and installation of expansion cards without the use of fasteners or tools.

SUMMARY OF THE INVENTION

Accordingly, the present invention is directed to a card retention assembly for retaining one or more expansion cards within the chassis of an electronic device such as a computer system, server, photocopier, facsimile machine, printer, or the like. In an exemplary embodiment of the invention, the chassis of the electronic device includes a tab retaining surface against which the tab of the mounting bracket of an expansion card rests when the expansion card is inserted in the chassis (i.e., seated in an expansion slot of the electronic device). A spring arm assembly is mounted to the chassis so that it may move between an open position and a closed position. The arm assembly includes a spring member suitable for engaging the tab and tab retaining surface when the arm assembly is in the closed position to at least partially restrain the tab against the tab retaining surface for securing the expansion card in the chassis.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Figure 1:
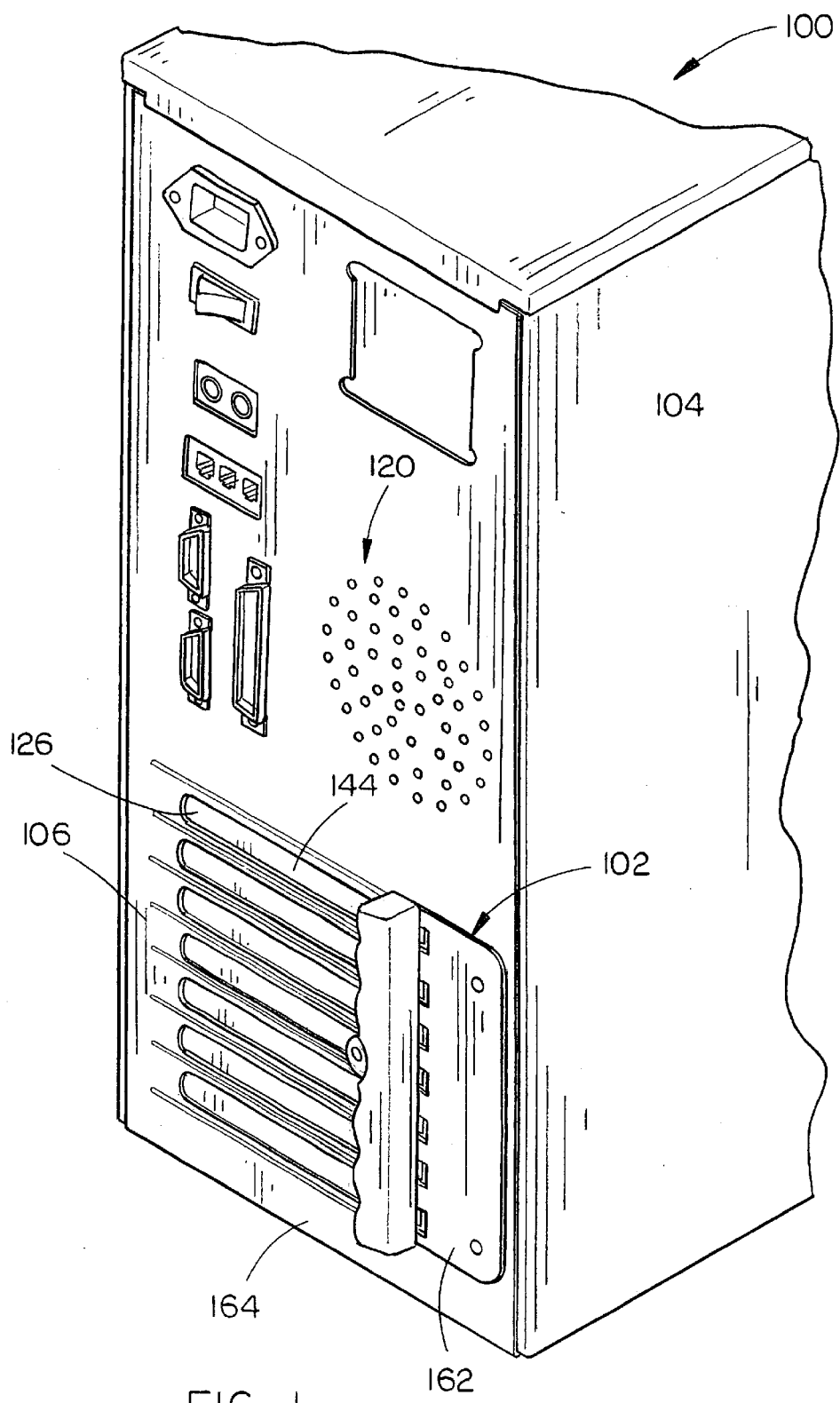
FIG. 1 is a partial isometric view illustrating a computer chassis including a card retention assembly in accordance with an exemplary embodiment of the present invention wherein the card retention assembly is closed.

Reference will now be made in detail to the presently preferred embodiments of the invention, examples of which is illustrated in the accompanying drawings.

Referring generally to FIGS. 1 through 7, a computer system 100 employing a card retention assembly 102 in accordance with an exemplary embodiment of the present invention is described. The computer system 100 includes a chassis 104 having an internal card cage assembly 106 providing a plurality of expansion slots 108 each capable of accommodating an expansion card 110 for providing functions or resources to the computer system and/or for extending the computer system's ability to communicate with or control peripheral devices coupled thereto (not shown).

Each expansion slot 108 is defined by a connector or socket 112 mounted to a printed circuit board 114 disposed within the computer system's chassis 104. When an expansion card 110 is received in an expansion slot 108, the card's edge connector 116 is seated within the connector 112 of that slot 108 thereby coupling the expansion card 110 to the printed circuit board 114.

Figure 3:
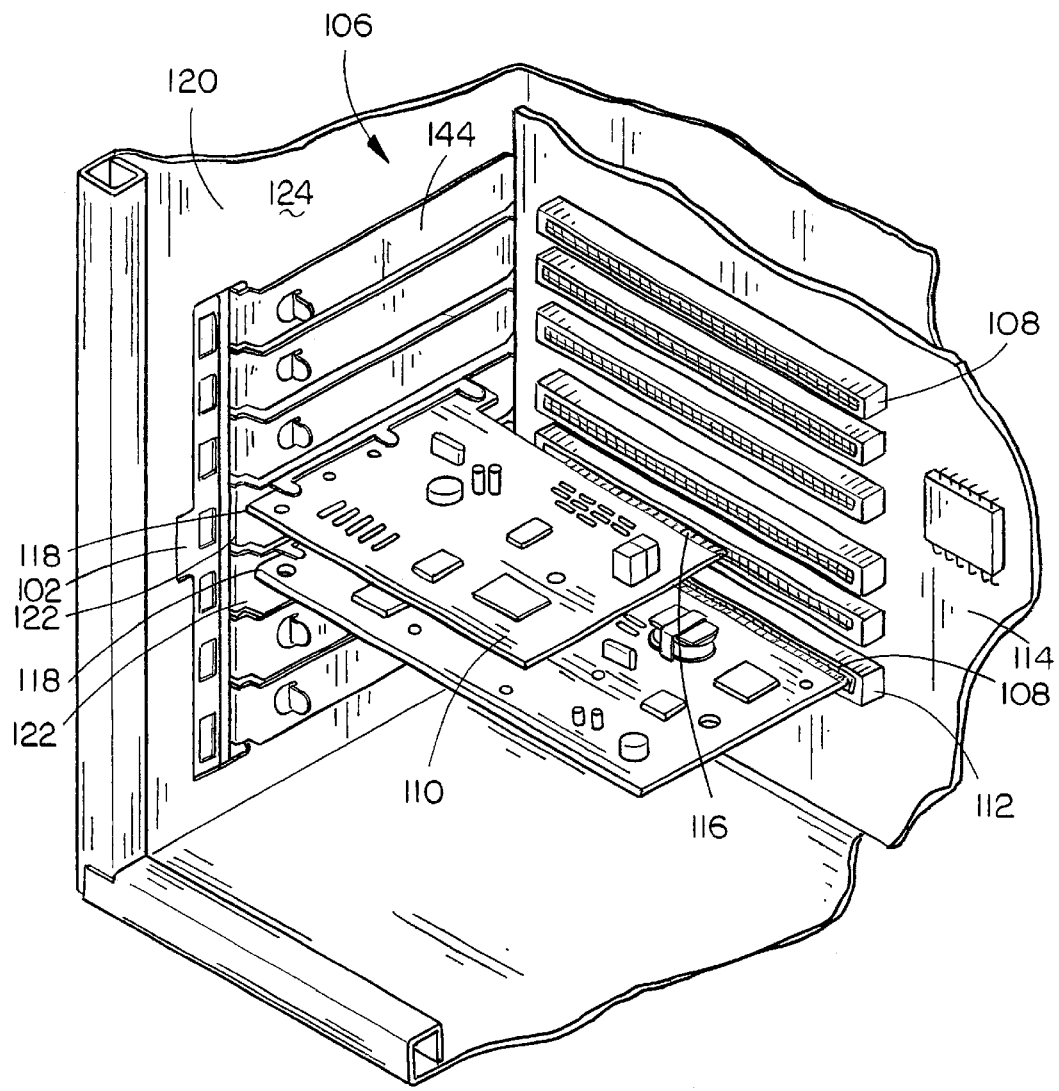
FIG. 3 is a partial isometric view of the computer chassis shown in FIG. 1, further illustrating expansion cards seated within expansion slots of a system board of the computer and retained within the chassis by the card retention assembly.
Figure 4:
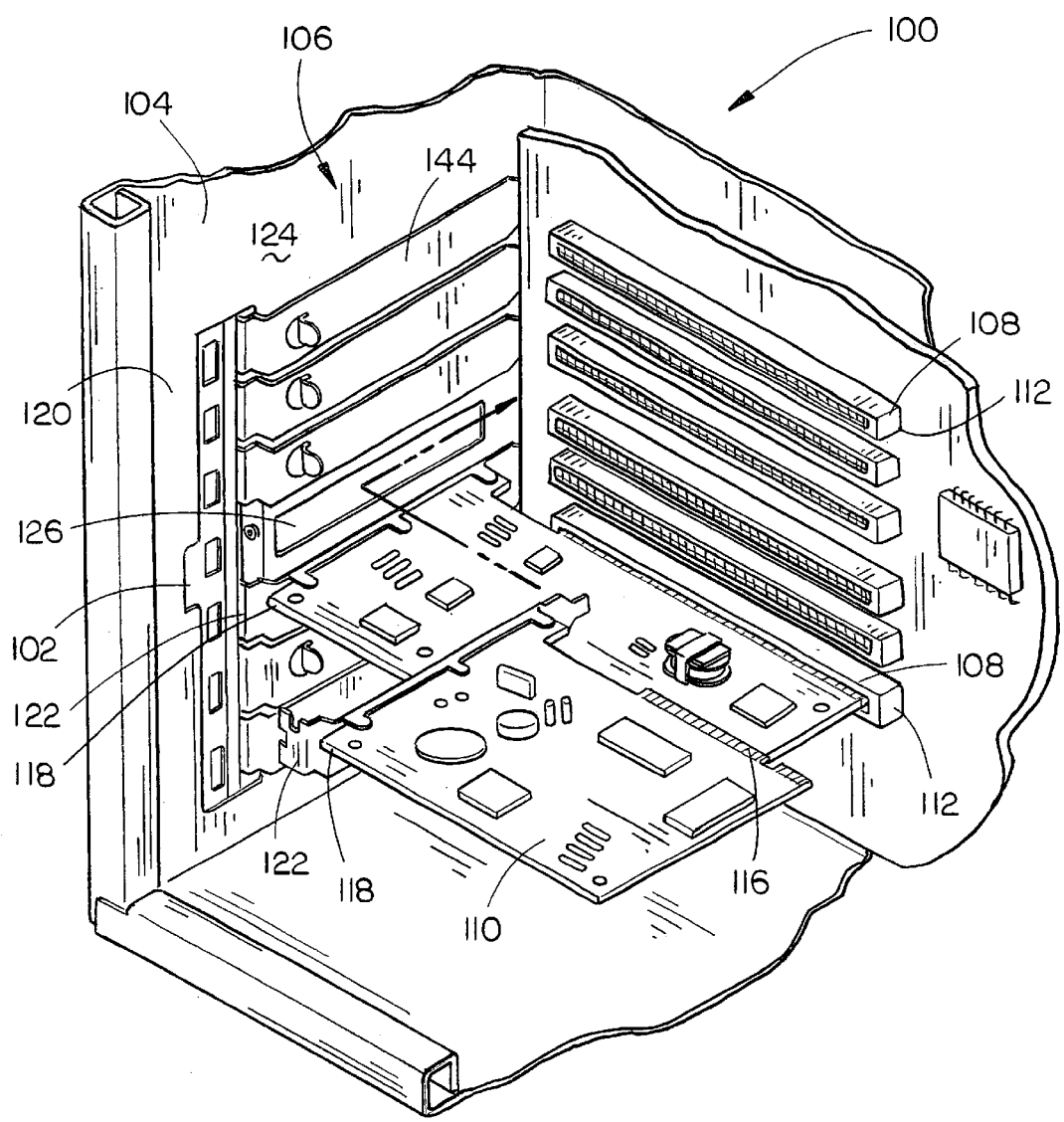
FIG. 4 is a partial isometric view of the computer chassis shown in FIG. 1, further illustrating removal of an expansion card from the computer.

In an exemplary embodiment, shown in FIGS. 3 and 4, printed circuit board 114 may comprise a main system board, motherboard, or the like which contains other electronic components of the computer system 100 such as the system's processor, main memory, bus controller, keyboard controller, video controller, and the like. Alternately, the printed circuit board 114 may comprise a secondary board or daughterboard mounted within the card cage assembly 106 and coupled to the computer system's motherboard. Further, in exemplary embodiments of the invention, expansion slots 108 may comprise connectors 112 suitable for mating with edge connectors 116 having various pin configurations. In such embodiments, the number of pins, and the width and depth of the pins supported by connectors 112 is determined by the interface standard utilized by the computer system bus, e.g., Industry Standard Architecture (ISA), extended industry standard architecture (EISA), Peripheral Component Interconnect (PCI), Micro Channel Architecture (MCA), Video Electronics Standards Association Local Bus (VL-BUS), or the like.

As shown in FIGS. 3 and 4, expansion slots 108 are oriented so that expansion cards 110 received therein are arranged in a spaced apart, generally parallel array wherein the end edges 118 of the cards 110 are substantially aligned with each other. Preferably, printed circuit board 114 is positioned within the chassis 104 so that expansion slots 108 are also sufficiently close to a wall of the chassis 104, such as the chassis' back panel 120, to allow the mounting bracket 122 of each card 110 received within an expansion slot 108 to rest against the inner surface 124 of the panel 120.

Expansion ports 126 comprised of elongated, generally rectangular apertures formed in back panel 120 are positioned adjacent to a connector 112 of printed circuit board 114. As shown in FIGS. 3 and 4, when an expansion card 110 is seated within an expansion slot 108, its mounting bracket 122 registers with a corresponding expansion port 126 allowing connectors 128–142 supported in the card's mounting bracket 122 to extend through the port 130 so they may be accessed by users of the computer system 100. If an expansion slot 108 is empty, i.e., does not hold an expansion card 110, an expansion port cover 144 may cover the expansion port 126 to prevent environmental contaminants from entering the chassis 104, and/or to shield the computer system's internal electronic components from electromagnetic interference (EMI).

In accordance with an exemplary embodiment of the present invention, card retention assembly 102 securely retains expansion cards 110 within their respective expansion slots 108 during shipping, transport and use of the computer system 100, while allowing installation and removal of expansion cards 110 without the use of fasteners or tools. The card retention assembly 102 also functions to secure expansion port covers 134 within empty expansion ports 126.

Figure 2:
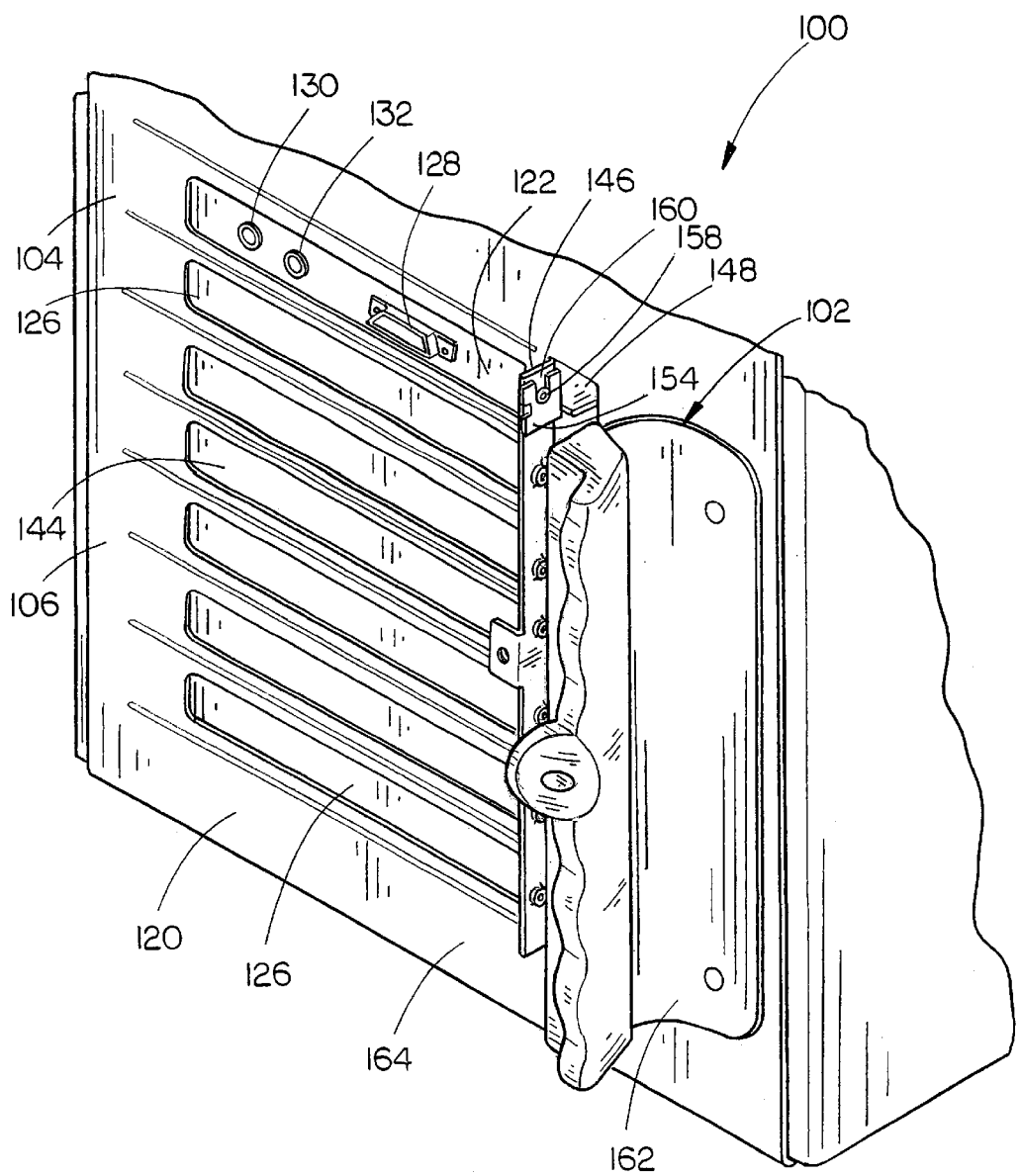
FIG. 2 is a partial isometric view of the computer chassis illustrated in FIG. 1, wherein the card retention assembly is shown open.
Figure 5:
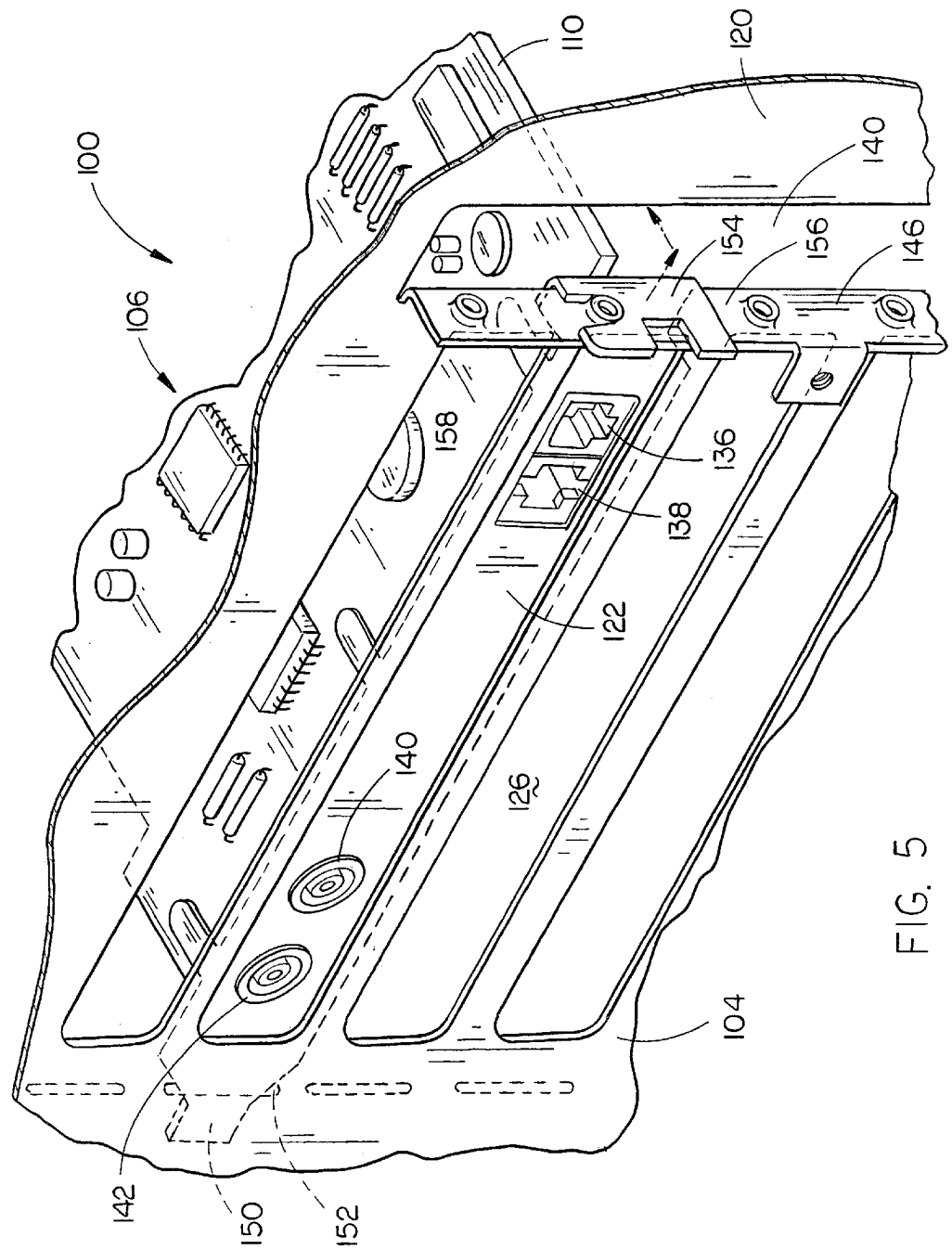
FIG. 5 is a partial isometric view of the computer chassis shown in FIG. 1, further illustrating an expansion card inserted within the computer chassis.

As shown in FIGS. 2 and 5, the card retention assembly 102 includes a ledge or lip 146 extending outwardly from back panel 120 immediately adjacent to the ends of expansion ports 126. Preferably, an aperture 148 is formed along substantially the entire length of the ledge 146 opposite expansion ports 126. When an expansion card 110 is installed within the card cage assembly 106 (i.e., so that its edge connector 116 is fully seated in a connector 112 of an expansion slot 108 as shown in FIGS. 3 and 4), the card's mounting bracket 122 is positioned against the inner surface 124 of back panel 120 so that downwardly extending tab 150 may engage slot 152, while outwardly extending tab 154 extends through aperture 148 and rests against surface 156.

Short protrusions 158 extend outwardly from surface 156. These protrusions 158 are positioned to engage notches or holes 160 formed in tabs 154 to prevent lateral movement of the expansion card 110 within its expansion slot 108. Protrusions 158 may, in the same manner, function to prevent lateral movement of expansion port covers 144 in empty expansion ports 126. In the exemplary embodiment shown in FIGS. 2 and 4, the protrusions 158 consist of the extruded rims of small holes formed in the surface 156 of ledge 146. Alternately, protrusion 158 may comprise raised posts, rivets, or like structures depending on design and manufacturing preferences.

Referring now primarily to FIGS. 1, 2, 6 and 7, expansion cards 110 are retained within expansion slots 108 by a spring arm assembly 162 mounted to the outside surface 164 of back panel 120. In an exemplary embodiment, the spring arm assembly 162 may be moved between an closed position, shown in FIGS. 1 and 7, wherein the spring arm assembly 162 engages the tabs 154 of expansion cards 110 for securing the cards 110 within their respective expansion slots 108 (see FIGS. 3 and 4), and an open position, shown in FIGS. 2 and 6, wherein the tabs 154 are released, allowing expansion cards 110 to be removed and installed within the card cage assembly 106 of chassis 104. When closed, the spring arm assembly 162 completely covers aperture 148 to prevent the intrusion of environmental contaminants into the chassis 104, and to reduce electromagnetic interference (EMI) with the computer system's electronic components.

Figure 6:
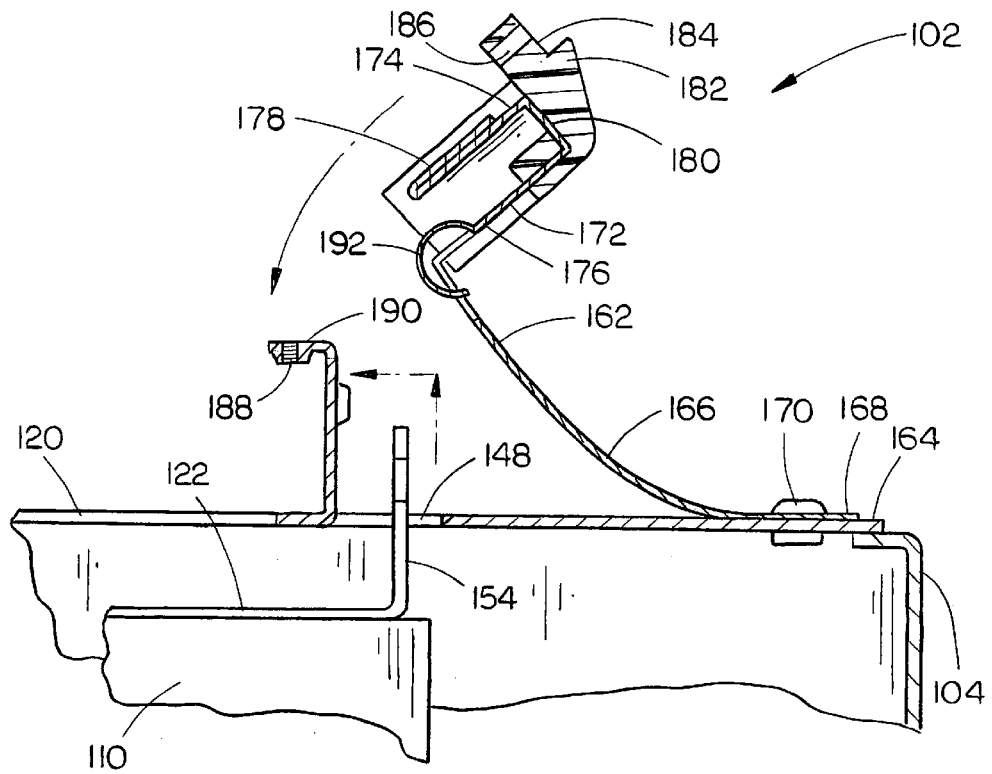
FIGS. 6 and 7 are partial cross-sectional views of the card retention assembly of the computer chassis shown in FIG. 1, wherein the card retention assembly is shown in the open position in FIG. 6 and in the closed position in FIG. 7.
Figure 7:
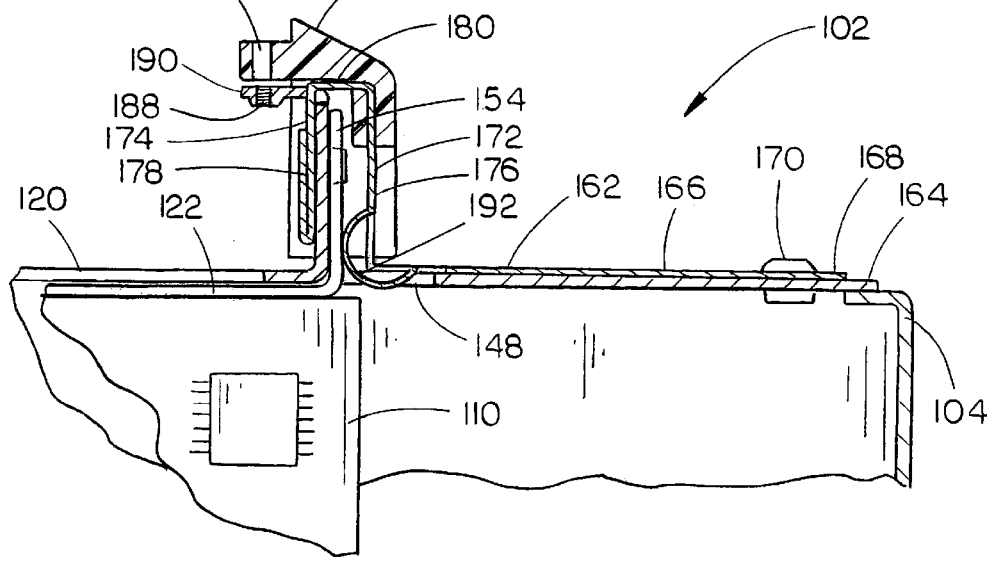

In an exemplary embodiment, shown in FIGS. 6 and 7, the spring arm assembly 162 includes a spring arm 166 formed of a thin sheet of a spring metal or like resilient, flexible material providing a spring bias tending to force the spring arm assembly 162 to the closed position. The spring arm 166 includes a first end 168 anchored to back panel 120 by fasteners 170 such as rivets, screws, bolts, or the like, and a second end 172 formed into a generally C-shaped channel 174 having inner and outer side wall portions 176 & 178 and top wall portion 180. A handle assembly 182 may be attached to channel 174 for providing a gripping surface by which the spring arm assembly 162 may be opened or closed. A surface 184 formed in the handle assembly 182 may include a hole 186 which overlies and registers with a second hole 188 formed in a bracket 190 extending from ledge 146 to receive a fastener, such as a thumb screw, screw, bolt, or the like (not shown). In this manner, spring arm assembly 162 may be locked in the closed position, for example, during shipping or transport of the computer system 100 from the manufacturer to a retailer or consumer, or to prevent accidental opening of the spring arm assembly 162 by a user or third party.

As shown in FIGS. 6 and 7, spring members 192 are formed in inner wall portion 176 and extend into channel 174 so that they may contact the tabs 154 of expansion cards 110 when spring arm assembly 162 is closed. When spring arm assembly 162 is closed, the spring members 192 clamp the tabs 154 and ledge 146 against the outer wall portion 178 of channel 174 so that the tabs 154 are at least partially restrained against surface 156 to prevent up and down movement of the expansion cards 110 (i.e., movement of the expansion cards 110 in directions generally perpendicular to printed circuit board 114 as shown in FIGS. 3 and 4) that could cause the card 110 to become unseated. Preferably, spring members 192 allow for variation in the height of expansion cards 110 that may be manufactured in accordance with industry standard tolerances.

In the exemplary embodiment of the invention shown in FIGS. 1 through 7, expansion cards 110 may be installed within the card cage assembly 106 of chassis 104 by first moving the spring arm assembly 162 to its open position, shown in FIGS. 2 and 6, by grasping handle assembly 182 and pulling outward away from back panel 120. This action unclamps the spring arm assembly's channel 174 from ledge 146 and causes its spring arm 166 to flex in a pivotal fashion shown in FIGS. 2 and 6. An expansion card 110 may then be inserted within an expansion slot 108 of the card cage assembly 106 so that its mounting bracket 122 is positioned against a corresponding expansion port 126 in the back panel 120. The edge connector 116 of expansion card 110 is seated within the expansion slot connector 112. Finally, the spring arm assembly 162 is moved to the closed position, shown in FIGS. 1 and 7, wherein spring members 192 clamp the tab 154 and ledge 146 together so that the tab 154 is at least partially restrained against surface 156.

Expansion cards 110 may be removed from card cage assembly 106 in a similar fashion by first moving the spring arm assembly 162 to its open position, thereby unclamping the tab 154 and ledge 146. The expansion card 110 to be removed may then be unseating from its expansion slot connector 112 by application of an outward force on the card 110, whereupon the spring arm assembly 162 may again be moved to its closed position.

In FIGS. 1 though 7, computer system 100 is illustrated herein as having a "tower" or "mini-tower" style chassis 104, wherein the chassis 104 is tall, narrow, and deep instead of a "desktop" style cabinet (not shown) which is instead short, wide and deep. However, it will be appreciated that the card retention assembly 102 of the present invention may be employed by computer systems 100 utilizing having a desktop style cabinet (not shown) by one of skill in the art without departing from the scope and spirit of the invention. It should further be recognized that the card retention assembly 102 of the present invention is not limited to use in computer systems, but may be utilized by any electronic device capable of utilizing expansion cards of the type described herein above. Such electronic devices may include, but are not limited to servers, photocopiers, facsimile machines, printers, televisions audio equipment, control equipment, medical equipment, and telecommunication equipment. Consequently, modification of such electronic devices to utilize the card retention assembly 102 described herein by one of skill in the art would also not depart from the scope and spirit of the present invention as defined by the appended claims.

It is believed that the card retention assembly of the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. A card retention assembly for retaining an expansion card of the type having a mounting bracket including a securing tab within the chassis of an electronic device, the card retention assembly comprising:

a tab retaining surface suitable for receiving the securing tab of the expansion card so that the securing tab rests against the tab retaining surface;

an arm assembly capable of being moved between an open position and a closed position, the arm assembly including an end having a channel formed therein for at least partially engaging the tab retaining surface when the arm assembly is moved to the closed position and a spring member disposed within the channel for engaging the securing tab when the arm assembly is in the closed position for at least partially restraining the securing tab of the expansion card against the tab retaining surface, wherein the arm assembly is suitable for securing the expansion card in the chassis.

2. The card retention assembly as claimed in claim 1, wherein the arm assembly comprises a spring arm for providing a spring bias tending to force the arm assembly to the closed position.

3. The card retention assembly as claimed in claim 1, wherein the tab retaining surface includes a protrusion for engaging an aperture formed in the securing tab of the expansion card for preventing lateral movement of the expansion card.

4. The card retention assembly as claimed in claim 3, wherein the protrusion comprises an extruded rim of a hole formed in the tab retaining surface.

5. The card retention assembly as claimed in claim 1, wherein the arm assembly comprises a handle assembly disposed about the channel, the handle assembly suitable for being grasped by a user for moving the arm assembly between the open position and the closed position.

6. The card retention assembly as claimed in claim 1, wherein the arm assembly is moved to the open position for insertion and removal of an expansion card.

7. The card retention assembly as claimed in claim 1, further comprising a fastener for securing the arm assembly to the tab retaining surface when the arm assembly is in the closed position.

8. A card retention assembly for retaining a plurality of expansion cards of the type having a mounting bracket including a securing tab within the chassis of an electronic device, the card retention assembly comprising:

a tab retaining surface suitable for receiving the securing tab of each of the plurality of expansion cards received in the chassis so that the securing tab rests against the tab retaining surface;

an arm assembly capable of being moved between an open position and a closed position, the arm assembly having an inner end attached to the chassis and an outer end suitable for at least partially engaging the tab retaining surface when the arm assembly is moved to the closed position, the outer end of the arm assembly including a channel formed therein for at least partially enclosing the tab retaining surface when the arm assembly is in the closed position and a plurality spring members disposed within the channel for engaging the securing tab of each of the plurality of expansion cards retained in the chassis when the arm assembly is in the closed position to at least partially restrain the securing tab against the tab retaining surface, wherein, when the arm assembly is moved to the closed position, the arm assembly is suitable for securing the plurality of expansion cards in the chassis.

9. The card retention assembly as claimed in claim 8, wherein the arm assembly comprises a handle assembly disposed about the channel, the handle assembly suitable for being grasped by a user for moving the arm assembly between the open position and the closed position.

10. The card retention assembly as claimed in claim 8, wherein the arm assembly comprises a spring arm extending between the first and second ends for providing a spring bias tending to force the arm assembly to the closed position.

11. The card retention assembly as claimed in claim 8, wherein the tab retaining surface includes a protrusion for engaging an aperture formed in the securing tab of the expansion card for preventing lateral movement of the expansion card.

12. The card retention assembly as claimed in claim 11, wherein the protrusion comprises an extruded rim of a hole formed in the tab retaining surface.

13. The card retention assembly as claimed in claim 8, wherein the arm assembly is moved to the open position for insertion and removal of an expansion card.

14. A card retention assembly for retaining a plurality of expansion cards of the type having a mounting bracket including a securing tab within the chassis of an electronic device, the card retention assembly comprising:

a tab retaining surface suitable for receiving the securing tab of each of the plurality of expansion cards received in the chassis so that the securing tab rests against the tab retaining surface;

an arm assembly movable between a closed position and an opened position, the arm assembly including a spring arm that is flexed when the arm assembly is moved to the opened position for providing a spring bias tending to force the arm assembly to the closed position, a channel formed in an outer end of the arm assembly for at least partially enclosing the tab retaining surface when the arm assembly is in the closed position, and a plurality spring members disposed within the channel for engaging the securing tab of each of the plurality of expansion cards retained in the chassis when the arm assembly is in the closed position, wherein the arm assembly engages the tab retaining surface in the closed position for at least partially restraining the securing tab of each of the plurality of expansion cards retained in the chassis against the tab retaining surface.

15. The card retention assembly as claimed in claim 14, wherein the spring arm comprises a sheet formed of a spring metal.

16. The card retention assembly as claimed in claim 14, wherein the arm assembly comprises a handle assembly disposed about the channel, the handle assembly suitable for being grasped by a user for moving the arm assembly between the open position and the closed position.

17. The card retention assembly as claimed in claim 16, wherein the arm assembly is moved to the open position for insertion and removal of one or more of the plurality of expansion cards retained in the chassis.

* * * * *